United States Patent
Maddix et al.

(10) Patent No.: US 6,232,143 B1
(45) Date of Patent: May 15, 2001

(54) MICRO PROBE RING ASSEMBLY AND METHOD OF FABRICATION

(75) Inventors: John Thomas Maddix, Plattsburgh, NY (US); Anthony Michael Palagonia, Underhill, VT (US); Paul Joseph Pikna, Enosburg Falls, VT (US); David Paul Vallett, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/448,110

(22) Filed: Nov. 23, 1999

Related U.S. Application Data

(62) Division of application No. 08/940,915, filed on Sep. 30, 1997, now Pat. No. 6,014,032.

(51) Int. Cl.$^7$ .................................................. H01L 21/44
(52) U.S. Cl. .......................... 438/100; 324/762; 324/754
(58) Field of Search ........................... 438/100; 324/762, 324/754

(56) References Cited

U.S. PATENT DOCUMENTS

| | | | |
|---|---|---|---|
| 3,731,191 | 5/1973 | Bullard et al. | 324/158 F |
| 4,801,866 | 1/1989 | Wixley | 324/73 PC |
| 4,956,923 | 9/1990 | Pettingell et al. | 33/558 |
| 5,116,462 | 5/1992 | Bartha et al. | 156/643 |
| 5,202,623 | 4/1993 | LePage | 324/158 F |
| 5,406,209 | 4/1995 | Johnson et al. | 324/750 |
| 5,471,458 | * 11/1995 | Oguchi et al. | 369/126 |
| 5,953,306 | * 9/1999 | Yi | 369/126 |
| 6,059,982 | * 5/2000 | Palagonia et al. | 216/11 |

* cited by examiner

*Primary Examiner*—Matthew Smith
*Assistant Examiner*—Renzo N. Rocchegiani
(74) *Attorney, Agent, or Firm*—Robert A. Walsh

(57) ABSTRACT

A multi-probe ring assembly including integral fine probe tips, conductive lines with terminal connection for testing semiconductor devices and a method of construction of the multi-probe ring assembly is described. The method of construction described utilizes the step of etching pits into silicon wafers to produce molds for forming the probe points. Semiconductor machining processes are used to complete the probe ring assembly.

10 Claims, 17 Drawing Sheets

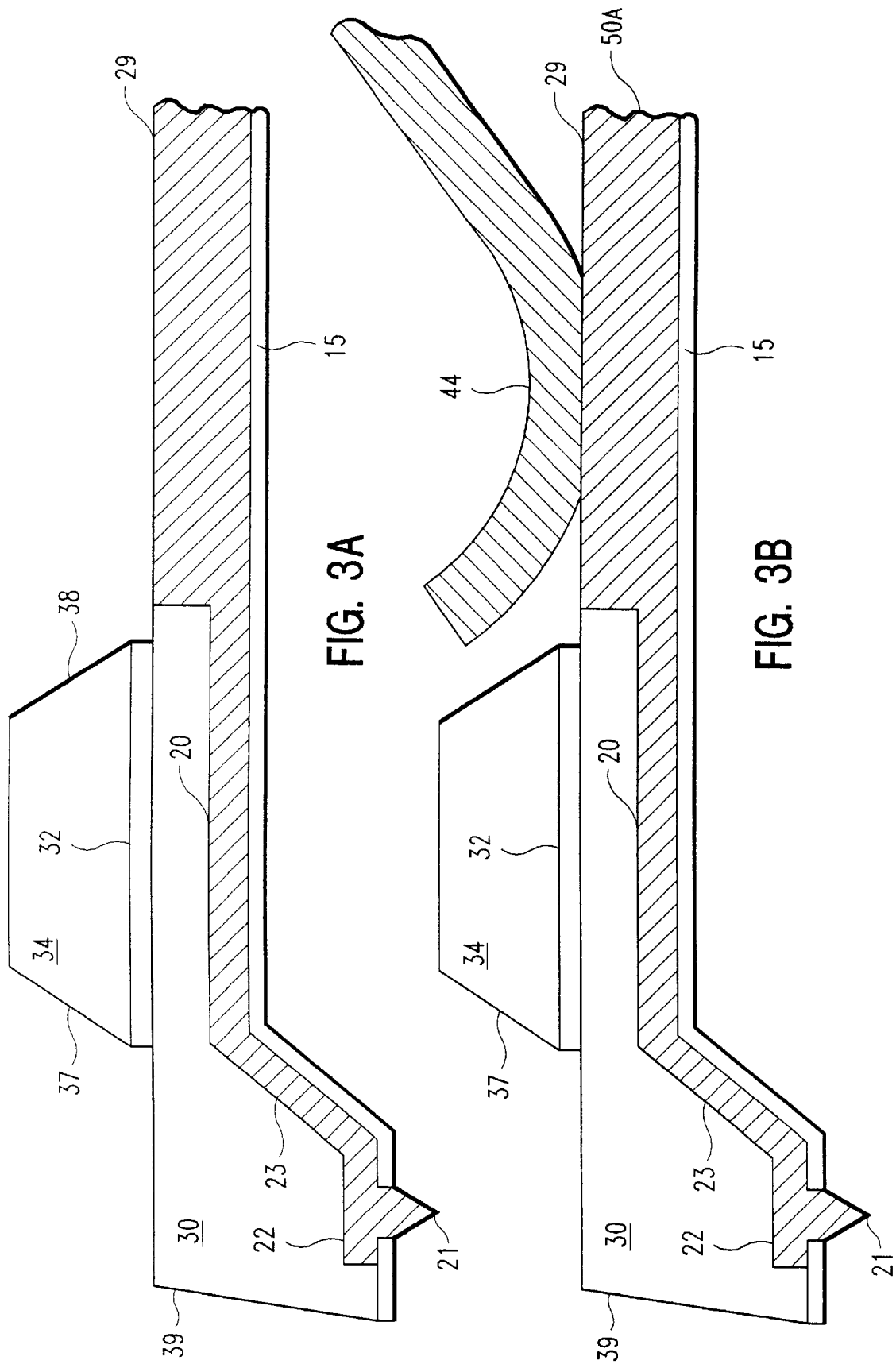

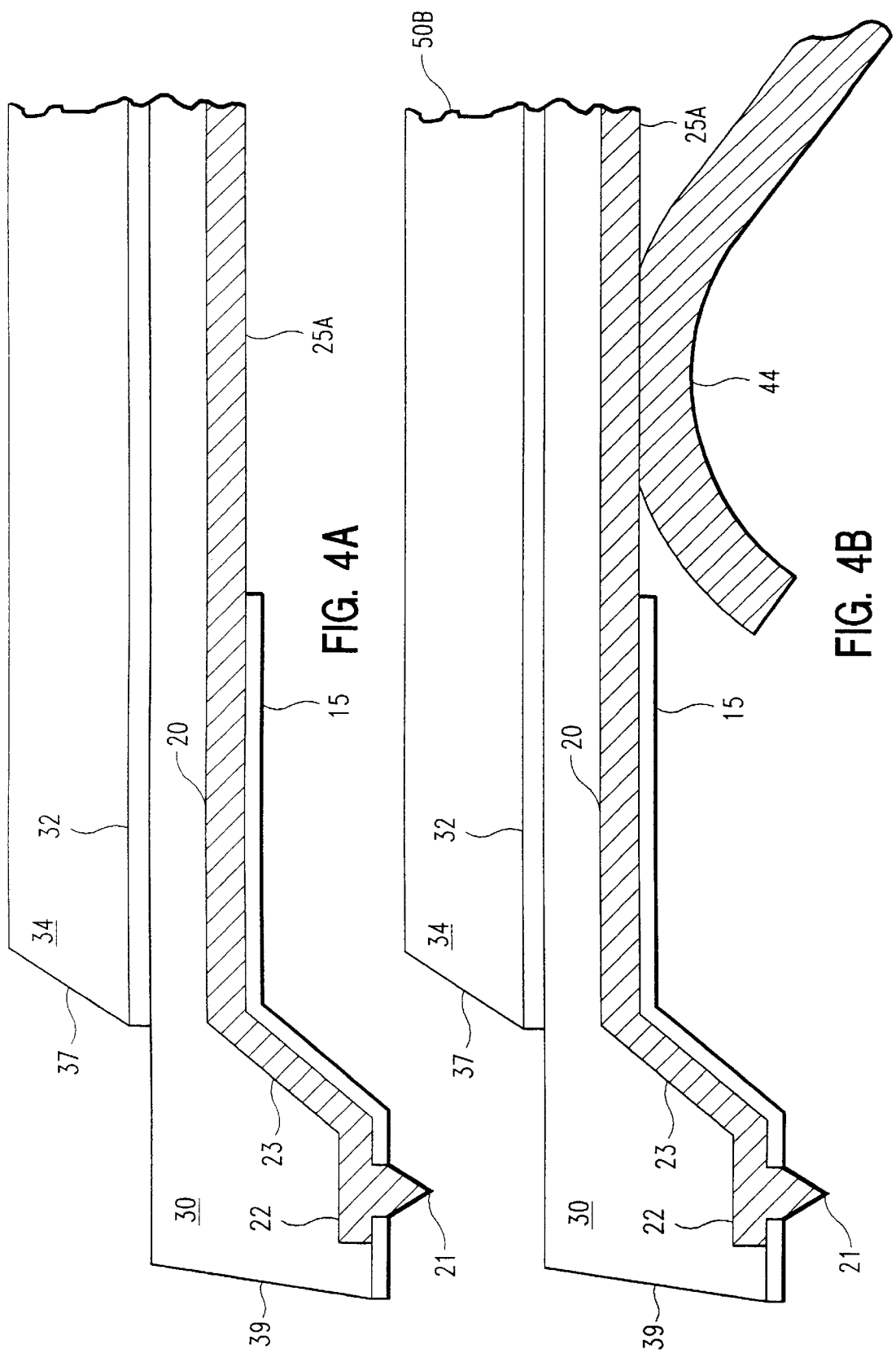

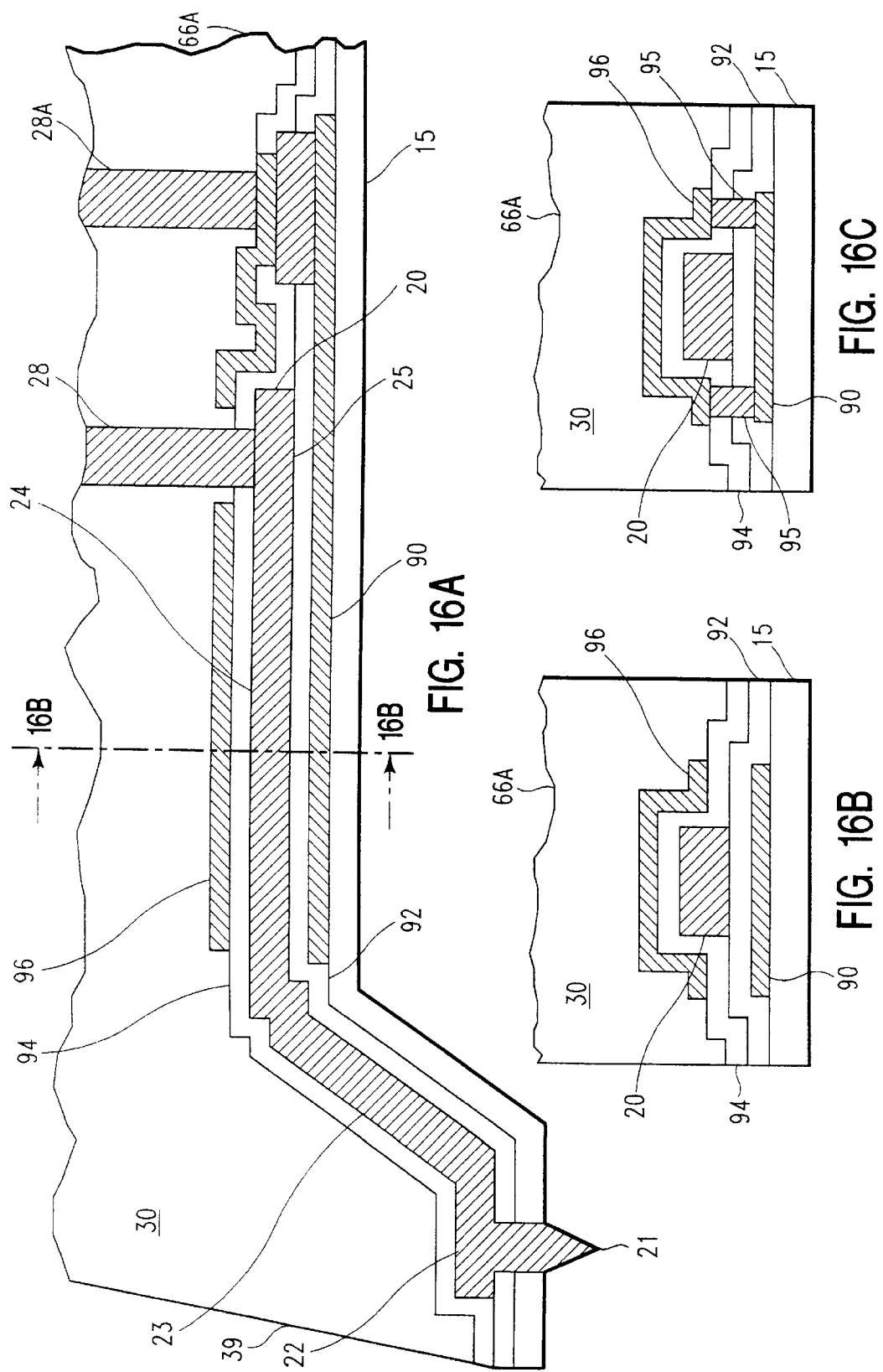

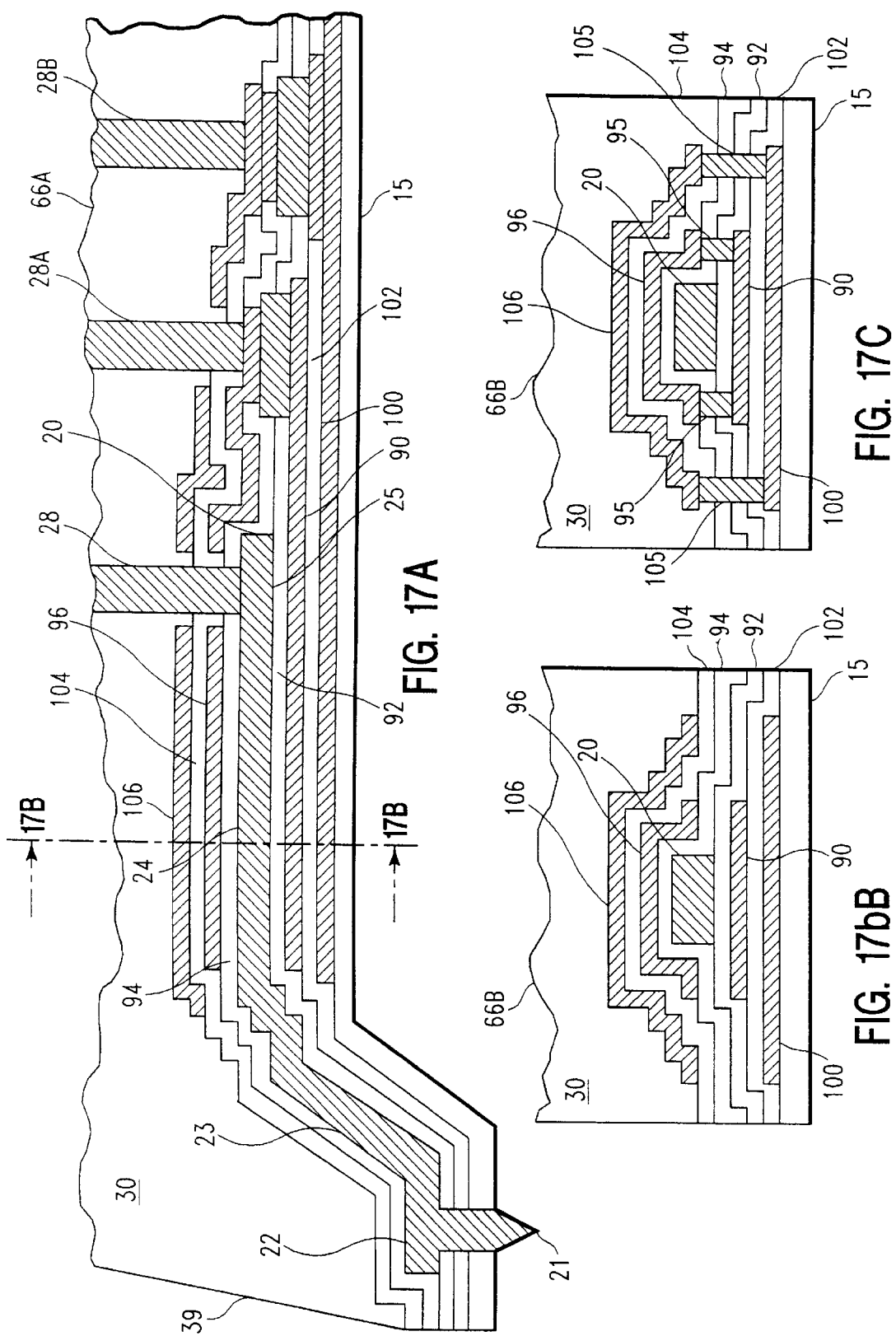

MICRO PROBE RING ASSEMBLY AND METHOD OF FABRICATION

This application is a division of Ser. No. 08/940,915 filed on Sep. 30, 1997 which has now issued as U.S. Pat. No. 6,014,032.

FIELD OF THE INVENTION

The present invention relates to apparatus for testing semiconductor devices and circuits and, more particularly, to a monolithic probe ring assembly including an integral fine probe point, conductive line and terminal connection for contacting the semiconductor devices and a method construction of the probe ring.

BACKGROUND OF THE INVENTION

In the course of testing semiconductor devices and circuits it becomes necessary to contact and electrically probe the devices and circuits to ascertain their function and determine failure mechanisms. To accomplish this, a finely pointed probe tip or group of finely pointed probe tips is brought into contact with the device or circuit by using pads connected to the device or circuit. As semiconductor devices become smaller and circuits denser, it becomes difficult to make electrical contact with the device with conventional probes, as the probe tips are either too large or too blunt to selectively contact only the intended device or circuit because they have a propensity to contact adjacent structures. Or, the tips are so thin as to bend when contact is attempted and slide off the probe terminal target circuit being tested. When multiple probes are required, it is often not possible to bring the correct number of probe tips close enough to each other because the size of the bodies will physically interfere with one another or will block the view of the target area being tested, thereby making alignment difficult or impossible.

As a result of these problems, pads on semiconductor devices which can number several hundred are often limited by the probe assemblies or probe rings used because of the size of the probe tips. This is especially true in the street or kerf regions between active dies on semiconductor wafers, wherein special test and process monitoring devices and circuits are often fabricated. The actual devices and monitoring structures are often very much smaller than the pads connected to them. A more compact probe assembly would allow smaller pads to be used allowing more devices in the same space or the same number of devices in a smaller space.

Turning to the prior art, a commonly used probe tip is described in U.S. Pat. No. 4,956,923 to Pettingell et al. The probe tip is mounted to a cantilever beam.

U.S. Pat. No. 5,116,462 to Bartha et al. describes a method of fabricating a micro-mechanical cantilever beam with an integral tip using a semiconductor which is reactive ion etch and the an-an-isotropic etch to form molds. Both of these prior art patents are hereby incorporated by reference.

SUMMARY OF THE INVENTION

It is an object of the present invention to overcome the problems encountered in the past by creating an improved probe assembly which includes an integral fine probe point, conductive line and terminal connection for contacting semiconductor devices. The present invention utilizes an an-isotropic wet etching of silicon wafers along crystal planes to produce pyramidal etch pits which are used as molds for the probe points. Points fabricated using this process would be precisely formed. Reactive ion-etching may be used to form the molds when slightly rounded points can be utilized. To provide clearance over the device to be tested, an anisotropic wet etching is used to lower a portion of the silicon surface and the etch pits are formed in this lower surface. Additional semiconductor processes may be used to complete construction of the probe assembly. A conductive layer is deposited and patterned to form an integral probe point, conductive line and terminal connection. A dielectric layer is then deposited and planarized. A support substrate is bonded to the dielectric layer and then reduced. Bonding pads are applied to interconnections made through the support structure, bonding material, and dielectric layer to the terminal portion of the probe assembly. The support structure, bonding material, and dielectric layer are selectively removed in a trench around the conductive layer. Finally the silicon wafer is etched away to free the probe assembly.

Because the tip has such a sharp point, intense electric fields can be generated that make the probe tip ideal for capacitive/inductive coupling to a device to be tested without actually contacting the device. It is therefore another object of the present invention to provide a method and apparatus for non-contact probing of semiconductor devices.

Multi-tipped probe assemblies may be constructed in a like manner, each tip having its own conductive line and terminal connection. Such multi-tipped probe assemblies may be constructed to conform with the size and layout of individual devices such as transistors or circuit lands. The surface of the silicon wafer may be lowered by different amounts in different regions such that the resultant probe points lie in different planes and conform to the topology of the device or structure to be tested.

Therefore it is a further object of the invention to provide a monolithic probe assembly having a plurality of very fine probe points for contacting semiconductor devices to be tested, as well as a method for constructing such a probe assembly.

Through the use of the present invention, probes may be fabricated with the sub-micron dimensions and multi-tipped probe assemblies may be fabricated with dimensions of a few microns.

It is also a further object of the present invention to provide monolithic probe rings or arrays of probes having very fine probe points for contacting semiconductor devices to be tested having test, power, or signal pads and a method of constructing such an array. The pads may be located along the periphery of the chip, dispersed throughout the chip, or especially arranged in the street or kerf regions between active chips on undiced wafers. Since such pads are much larger than individual devices or circuit lands, the probe assemblies made by the method of the present invention for this purpose are proportionally larger, though the conductive lines need not be. Therefore, additional conductive and dielectric layers may be formed below and above the conductive line portion of the probe assembly, effectively providing for coaxial and triaxial wiring up to the probe point.

It is another object of the present invention to provide a probe ring assembly which includes probes having conductive shielding surrounding a central conductor which is integral to the probe point and terminal connection and a method for constructing such a ring assembly.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIGS. 3A and 3B show a sequence of cross section views illustrating a method for forming a terminal connection for a conductive probe tip;

FIGS. 4A and 4B show a sequence of cross section views illustrating a further alternative method for forming a terminal connection to the conductive probe tip;

FIG. 16A is an enlarged cross section view of a single probe of the probe assembly illustrated in FIG. 13 with additional upper and lower conductive shields around the line connecting the probe tip and the terminal connection to the probe tip;

FIG. 16B is a cross section view through AA of FIG. 16A;

FIG. 16C is a cross section view through AA of FIG. 16A showing an alternative connection scheme between the upper and lower conductive shields;

FIG. 17A is an enlarged cross section view of a single probe of the probe assembly illustrated in FIG. 13 with an additional pair of upper and lower conductive shields around the line connecting the probe tip and the terminal connection to the probe tip;

FIG. 17B is a cross section view through AA of FIG. 17A; and

FIG. 17C is a cross section view through AA of FIG. 17A showing an alternative connection scheme between the upper and lower conductive shields of each pair of conductive shields.

Corresponding reference characters indicate corresponding parts throughout the several views of the drawings.

DETAILED DESCRIPTION OF THE INVENTION

Figure 1A:
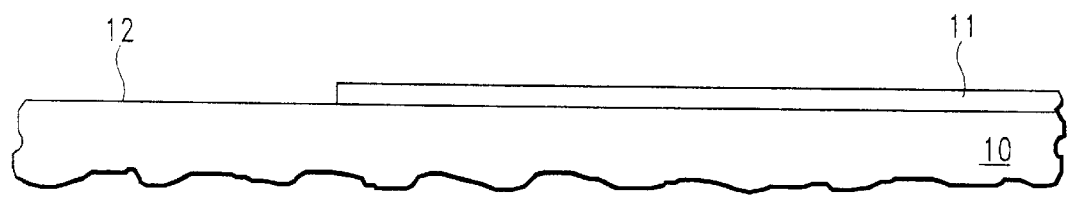
FIGS. 1A–1I show a sequence of cross section views illustrating the process steps of a method for fabricating a conductive probe tip according to the present invention.
Figure 1B:
Figure 1C:
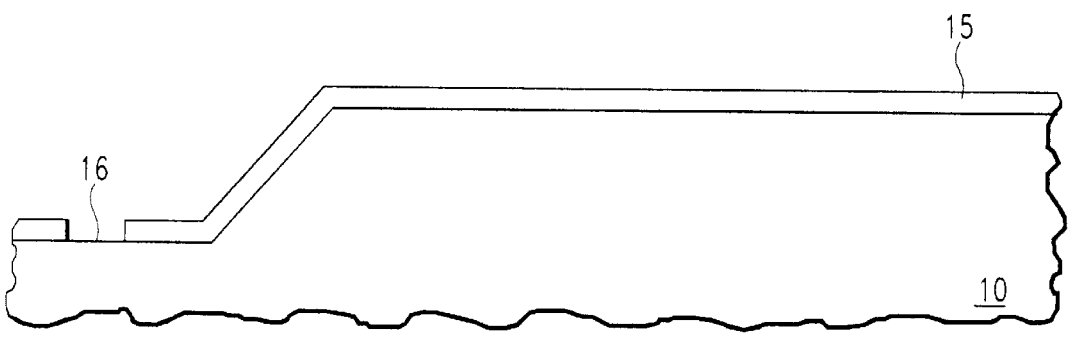
Figure 1D:
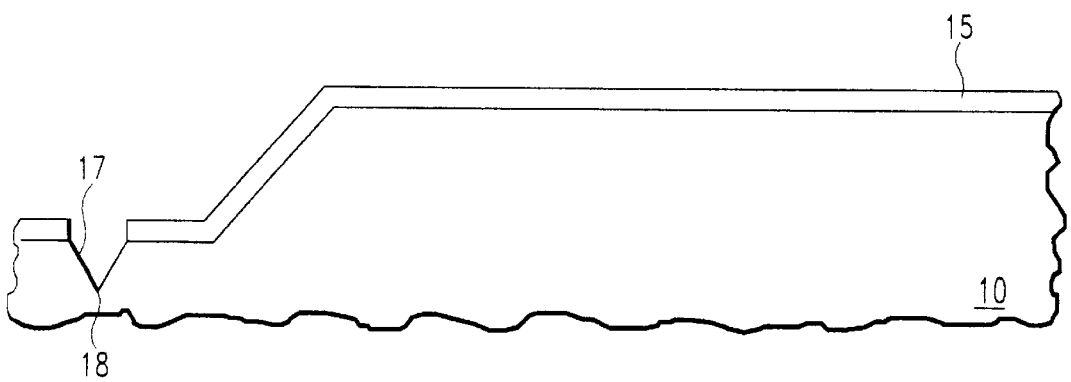

In FIG. 1A silicon substrate 10 has a mask layer 11 on its top surface into which an opening 12 has been etched. This mask layer may be thermally grown silicon oxide, CVD silicon oxide or CVD silicon nitride. It is critical to the invention that the silicon substrate 10 have a crystal orientation of <100> in order for it to be selectively etched with an an-isotropic etch. Suitable etchants include: a heated (65° C.) saturated aqueous solution of a tetra methyl ammonium hydroxide; a heated saturated solution of potassium hydroxide in 80% isopropanol; a heated 30–40 wt % aqueous potassium hydroxide; or a refluxing ethylenediamine/pyrocatechol/water mixture. These mixtures etch along the <111> crystal plane much slower than along any other plane. The sidewalls of pits or trenches etched in <100> silicon substrates will lie on the <111> crystal plane. In FIG. 1B the silicon etch has been stopped before a complete pyramidal etch pit has been formed, so the resulting etched trench is a sloped sidewall 13 and a flat bottom 14 which are required in subsequent steps. Mask layer 11 is then removed by conventional techniques. In FIG. 1C opening 16 has been etched into a second mask layer 15 which has been formed upon the top surface of silicon substrate 10. The silicon substrate is then etched with an anisotropic etch a second time. However the etch is allowed to proceed until a full pyramidal etch pit has been formed having sloped sidewalls 17 meeting in point 18, as shown in FIG. 1D. Next a metal layer is deposited on top of mask layer 15 and patterned. The metal may be tungsten, copper, aluminum, gold or another conductive material.

Figure 1E:
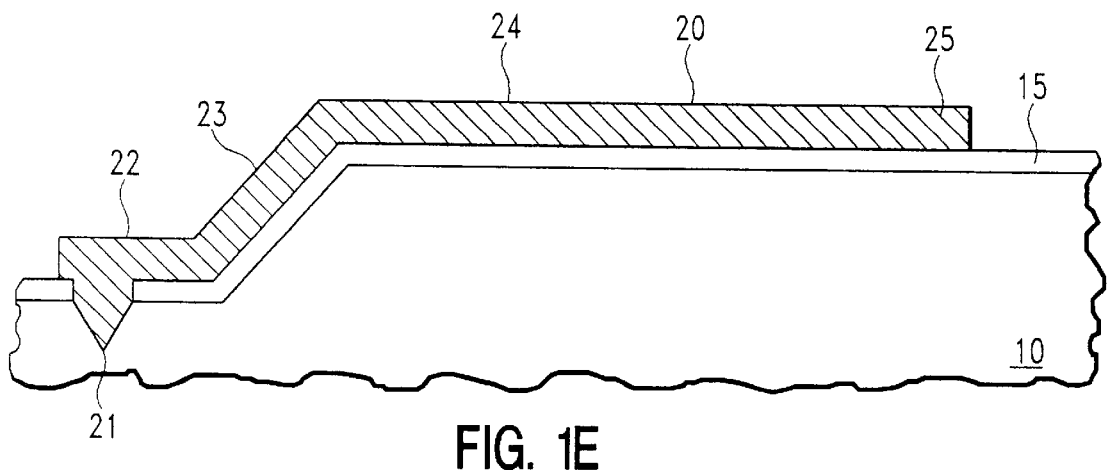
Figure 1F:
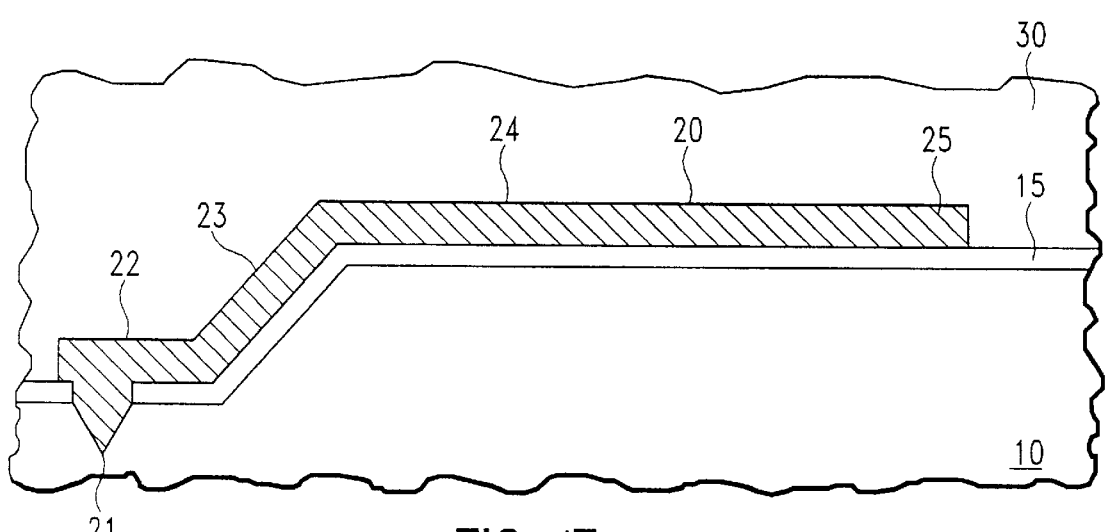
Figure 1G:
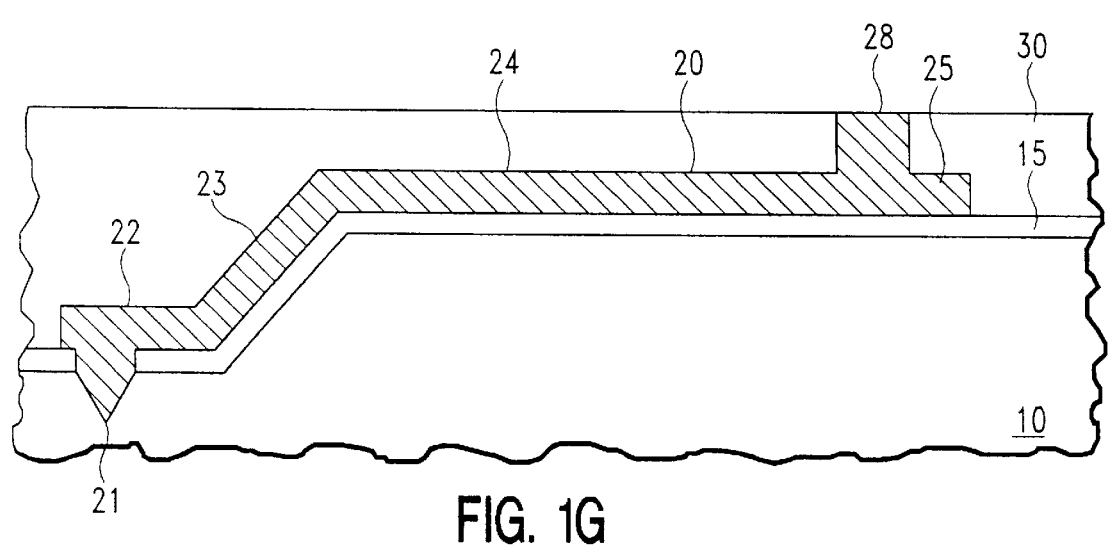
Figure 1H:
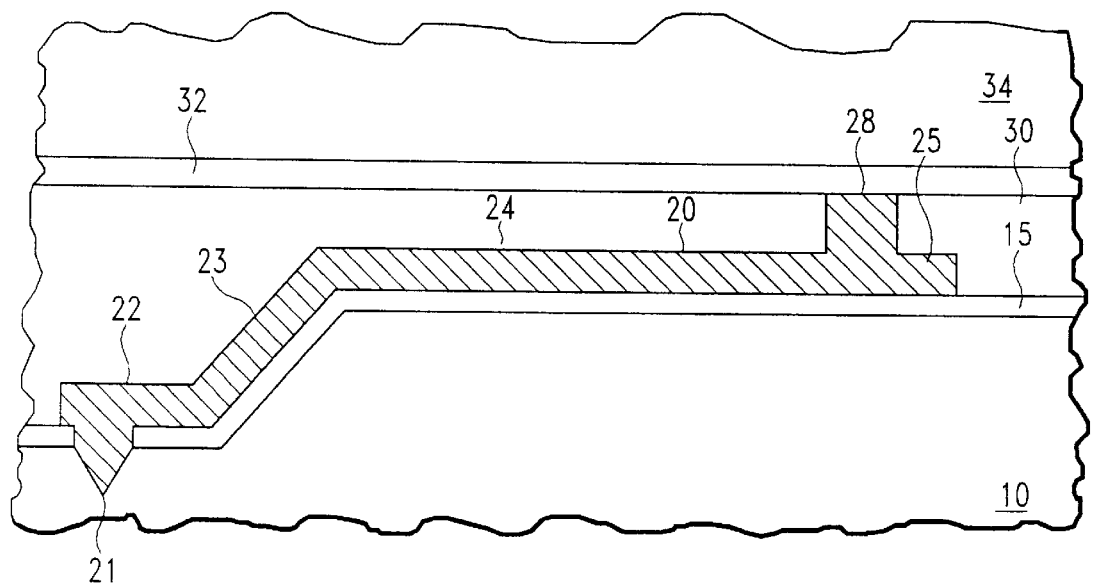
Figure 1I:
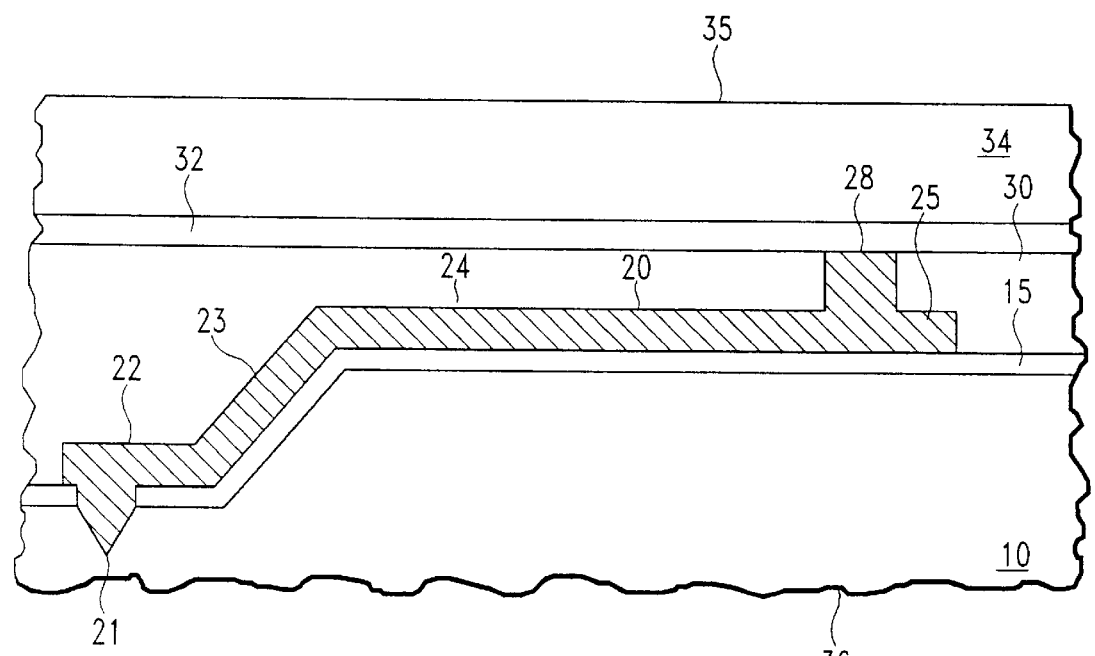
Figure 11A:
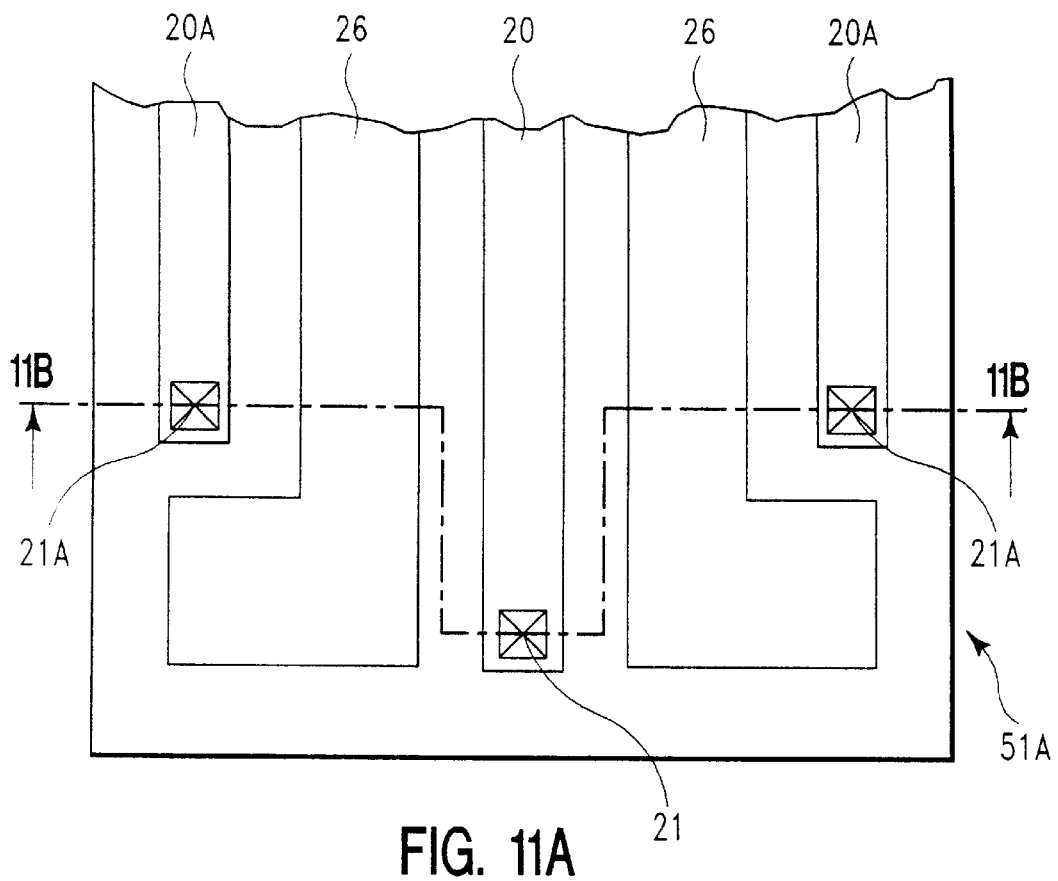
FIG. 11A is a top plan view of a portion of an electrical probe assembly having multiple probe tips of different heights made according to the present invention for probing a small structure.

For probes to be used in contact mode, the metal should be hard, making tungsten a preferred material. For non-contact mode probes, it is more important for the metal to be highly conductive, so copper, aluminum or gold would be preferred. FIG. 1E shows metal conductive line 20 having a terminal end 25, intermediate portion 24, sloped portion 23 and tip portion 22. Tip portion 22 has a probe tip point 21. FIG. 1E shows a thick dielectric layer 30 such as a chemical vapor deposit (CVD) oxide has been deposited on top of the metal conductive line 20. Dielectric layer 30 is then thinned by a chemical-mechanical polishing (CMP) process. In FIG. 1G a recessed stud contact 28 has been formed in dielectric layer 30 making electrical contact to terminal end 25 of metal conductive line 20. In FIG. 1H a layer of adhesive 32, which may be epoxy or an epoxypolyimide-epoxy sandwich, is applied to dielectric layer 30 to join with the support substrate 34. Support substrate 34 may be another silicon substrate or a quartz substrate. Quartz provides the added benefit of being transparent which would be useful in some of the embodiments of the present invention. In FIG. 11 silicon substrate 10 has been thinned down to form a surface 36 and support substrate 34 has been thinned down to form a surface 35 by CMP processes. Next the silicon substrate 10 is completely etched away. The thinning silicon substrate 10 prior to completely etching it away is to reduce the time and lateral etching that would otherwise occur. Dielectric 30 and support substrate selectively etched to form individual probes or probe assemblies comprising groups of probes will be discussed below.

Figure 2A:
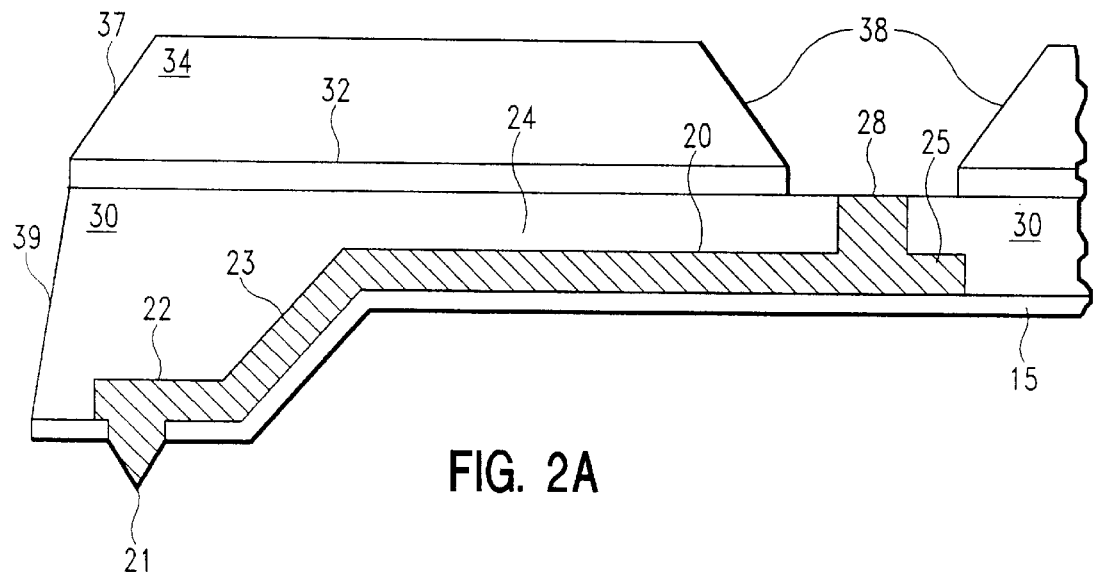
FIGS. 2A and 2B show a sequence of cross section views illustrating a method for forming terminal connection for a conductive probe tip.
Figure 2B:
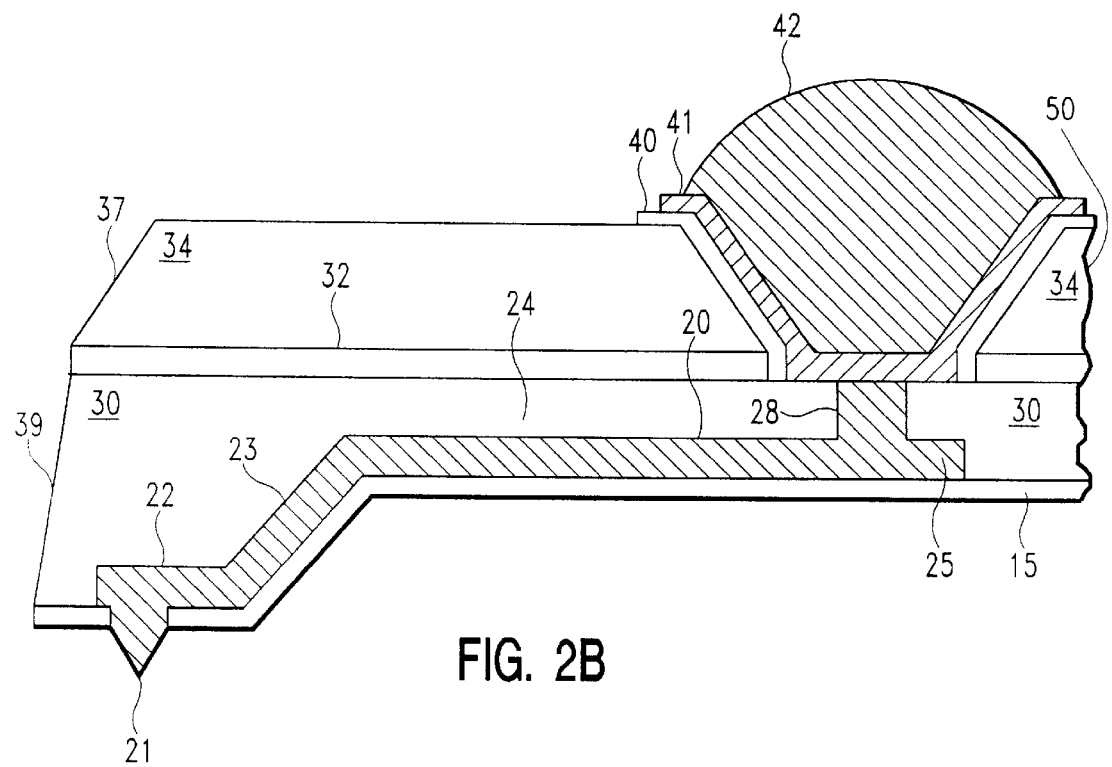

Attention is now directed to FIG. 2 which illustrates a first method of completing the probe tip in which a lead tin/ball connection is made to the stud 28 of the conductive line 20. In FIG. 2A dielectric layer 30 has been etched to form sidewalls 39 and support substrate 34 has been etched to form sidewalls 37. Mask layer 15 and adhesive layer 32 have also been etched. Further via 38 has been formed in support of substrate 34 and the adhesive layer 32 removed at the bottom of via 38 exposing stud 28. Completed probe tip 50 is shown in FIG. 2B. A lead/tin solder ball 42 has been formed over a transitional metal layer which has been formed over dielectric layer 40. Dielectric layer 40 has been removed from the bottom of via 38 to allow electric contact between stud 28 and lead/tin solder ball 42 through transitional metal 41. Thus, an electrical path has been fabricated from lead/tin ball 42 to probe tip point 21. The transitional metal 41 may comprise a chrome/copper/gold sandwich or similar ball-limiting metallurgies. As mentioned above, support for the substrate 34 may be quartz, an insulator. If the support substrate itself is a dielectric, as for example quartz, layer 40 is not required.

Attention is now directed to FIG. 3 in which another embodiment is illustrated of a method for completing the probe tip and providing an electrical connection to the conductive line 20. In FIG. 3A dielectric layer 30 has been etched to form sidewall 39 and support substrate 34 has been etched to form sidewall 37. Mask layer 15 and adhesive layer 32 have also been selectively etched away. Further via 38 has been formed in support substrate 34 and the adhesive layer 32 is removed at the bottom of via 38 exposing contact pad 29. Contact pad 29 is a larger form of contact stud 28. Completed probe tip 50A is shown in FIG. 3B. Wire 44 has been bonded to contact pad 29. Gold and aluminum are common wire materials. Thus, an electrical path has been fabricated from wire 44 to probe tip point 21.

Attention is directed to FIG. 4 in which an additional embodiment is illustrated of a method for completing the probe tip and providing an electrical connection to the conductive line 20. In FIG. 4A dielectric layer 30 has been etched to form sidewall 39 and support substrate 34 has been etched to form sidewall 37. Mask layer 15 and adhesive layer 32 have also been etched. Further, mask layer 15 has been removed from the bottom side of the terminal end 25A of conductive line 20. Completed probe tip 50B is shown in FIG. 4B. A wire 44 has been bonded to the bottom side of the terminal end 25A of conductive line 20. Gold and aluminum are common wire materials. Thus, an electrical path has been fabricated from wire 44 to probe tip point 21.

Figure 5A:
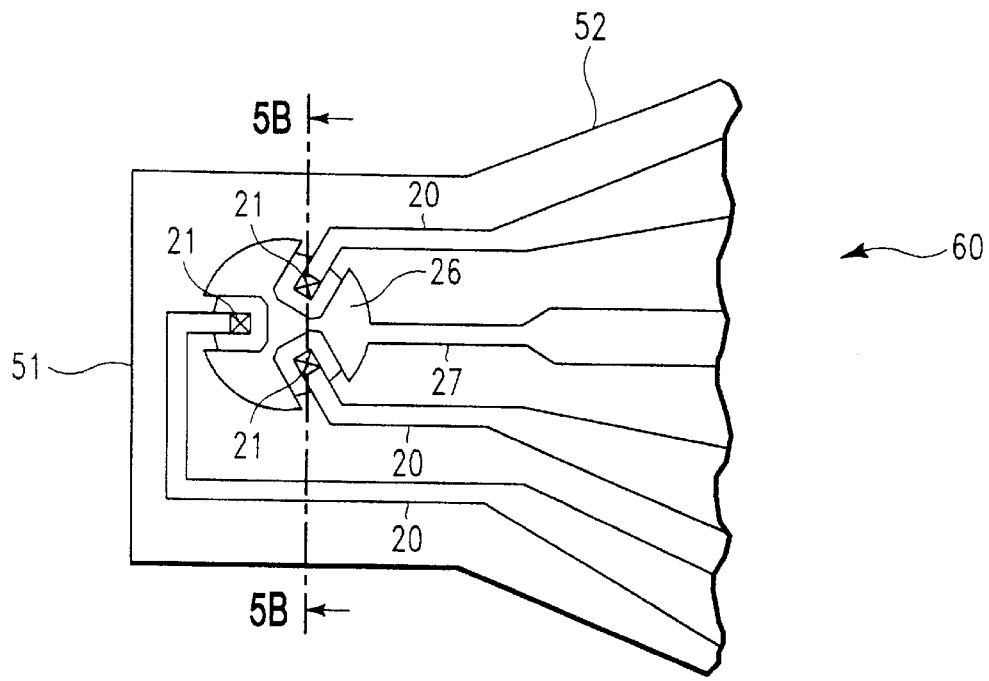
FIG. 5A is a top plan view of a portion of an electrical probe assembly having multiple probe tips made according to the present invention, for probing a small structure.
Figure 5B:
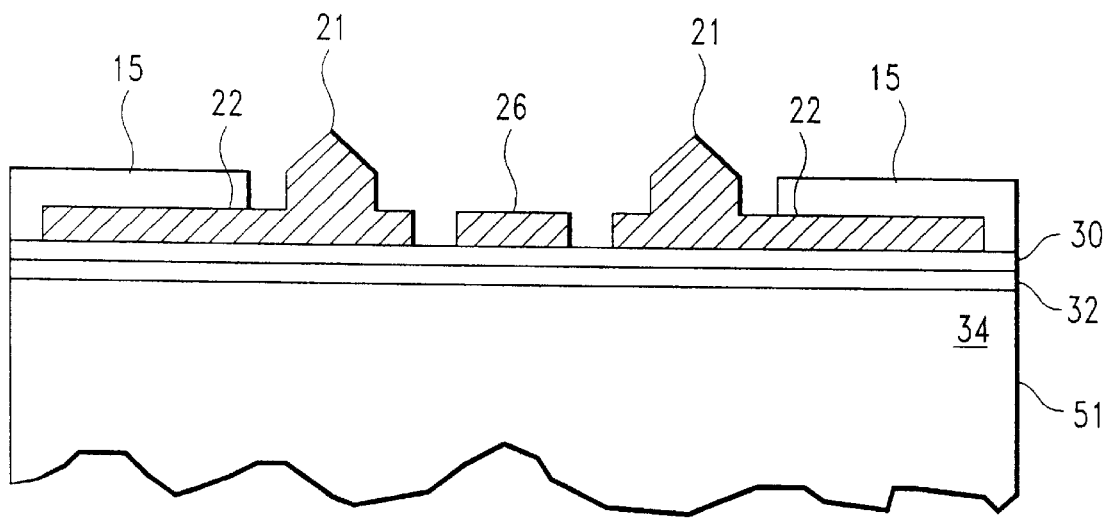
FIG. 5B is a cross section view through AA of FIG. 5A.

FIG. 5A shows a top view portion of an embodiment of a multi-tipped probe assembly 60 which is intended for probing small structures such as individual transistors or groups of sub-micron lands on a semiconductor device. Three lands 20 terminate in three probe tip points 21. Further a land 27 connected to shield 26 is formed to surround each probe tip point 21 as nearly completely as possible. This shield is only required when the tip is used in non-contact mode. If the probe tip is to be used by contacting the device to be tested physically, it may be omitted. The structures are disposed upon probe assembly tip 51 which transitions to probe assembly intermediate section 52. While three probe tip points 21 are shown, more or less are possible. By way of example, three tip points 21 are shown to correspond to the source, drain and gate of a transistor. For a bipolar transistor, tips for base, emitter and collector would be provided. For other devices or device structures, more or less probe tips would be provided. The arrangement of the individual tips may be matched to the structure being tested. In FIG. 5B probe tip points 21 extend above shield 26 and mask layer 15. Dielectric layer 30, adhesive layer 32 and support substrate 34 are also shown. Individual lines can be fabricated as narrow as 0.1 microns using e-beam or x-ray lithography. The space between tips, allowing for the shield can be as small as 0.5 microns. The probe assembly tip 50 can be made extremely small to accommodate smaller drives; e.g., 1.5 microns wide by 6 microns long.

Figure 6A:
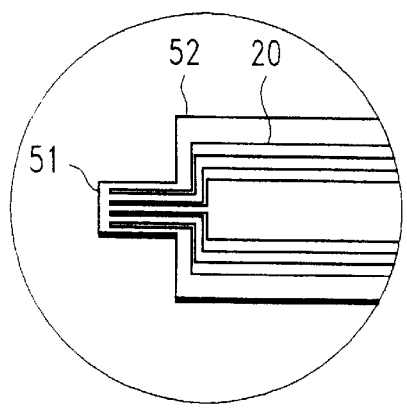
FIGS. 6A and 6AA are top plan views of an electrical probe assembly with portions missing using the probe tip illustrated in FIG. 4B adapted for mounting to a manipulating arm.
Figure 6A:
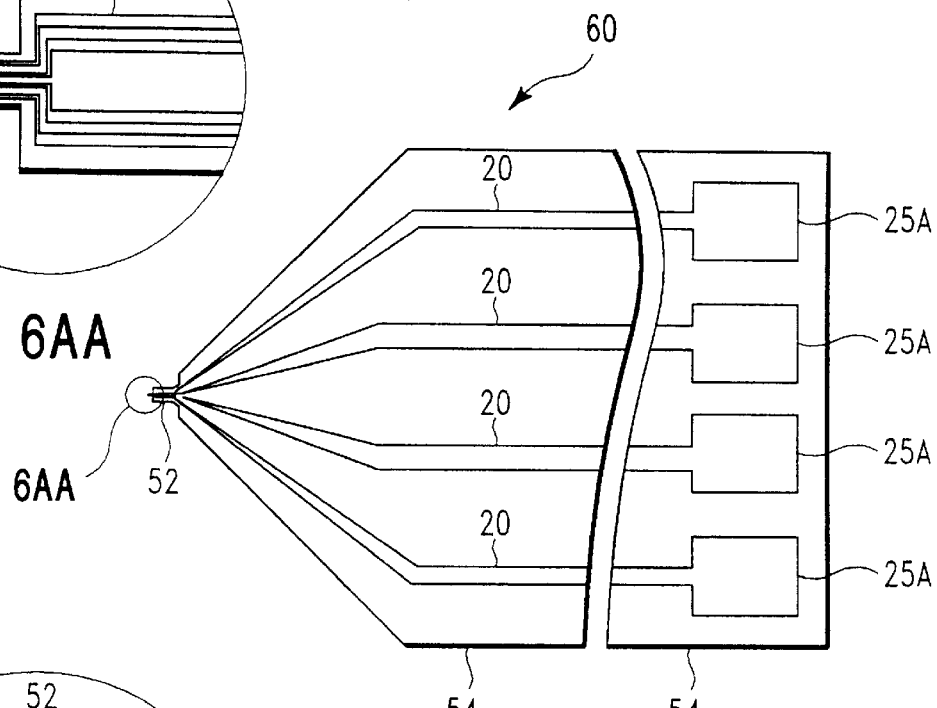
Figure 6B:
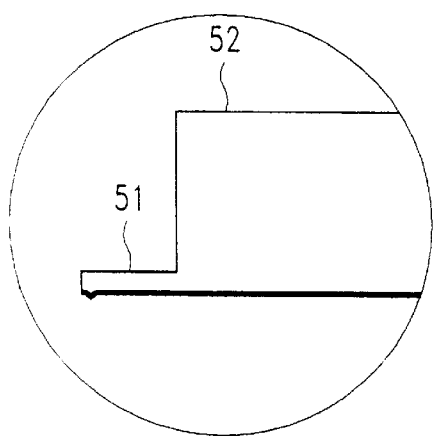
FIGS. 6B and 6BA are side views of the electrical probe assembly shown in FIGS. 6A and 6AA.
Figure 6B:
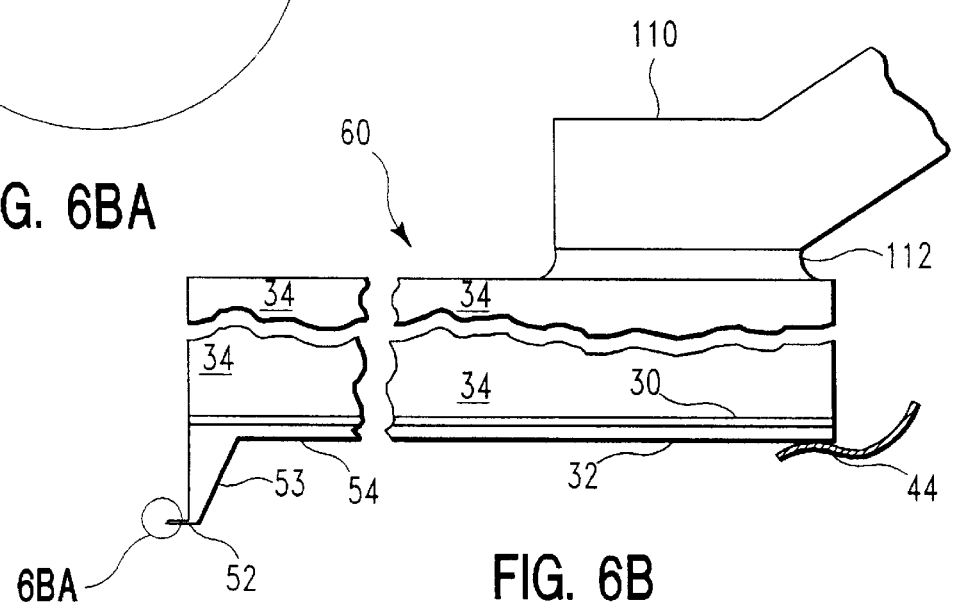

FIG. 6A shows a complete top view of the multi-tipped probe assembly 60. Probe assembly tip 51 expands into the probe assembly intermediate section 52. In this example, the probe assembly intermediate section is approximately 15 microns wide by 30 microns long. Probe assembly intermediate section 52 expands into probe assembly terminal section 54 having pads 25A for connection to test equipment. By way of example, the probe assembly terminal section is approximately 600 microns by 6000 microns. In FIG. 6B it can be seen that probe assembly tip 51 is significantly smaller than probe assembly intermediate section 52 and that probe assembly terminal section 54 is offset from the plane that includes sections 51 and 52. Wire connection 44 is shown on the lower side of the probe assembly and the top of the probe assembly 60 has been mounted to thick tungsten wire 110 by epoxy 112. The thick wire can then be mounted in a device for controlling movement such as a micro-manipulator.

Figure 7:
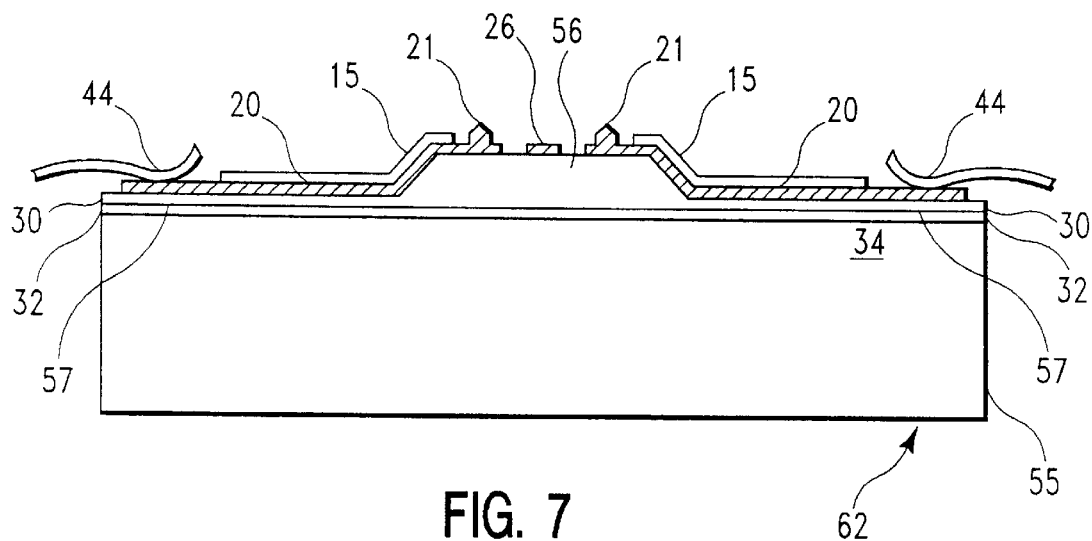
FIG. 7 is a cross section view of a portion of the electrical probe assembly illustrated in FIGS. 5A and 5B adapted to be mounted to a surface.
Figure 8:
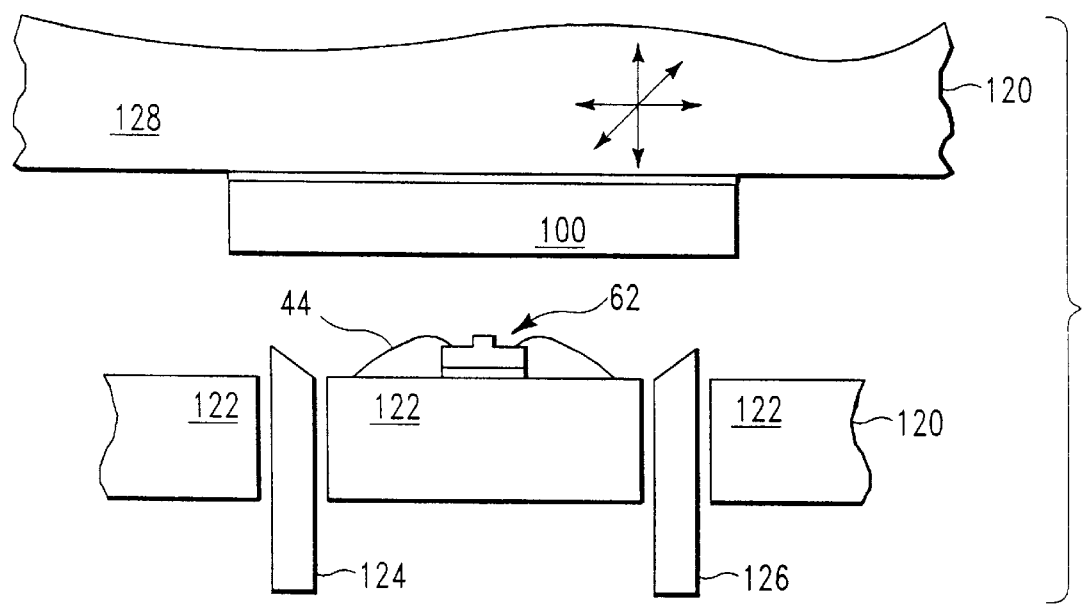
FIG. 8 is a cross section view of the electrical probe assembly illustrated in FIG. 7 mounted in an assembly for aligning the probe tips to a device to be tested.

FIG. 7 shows another embodiment of a multi-tipped probe assembly which is intended for probing small structures such as individual transistors or groups of submicron lands on semiconductor devices. Probe tip point 21 and shield 26 are raised and located in a central raised portion 56 of multi-tipped probe assembly 62. Conductive line 20 connects the probe tip point 21 to wire 44 in region 57 of multi-tipped probe assembly 62. The offset in elevation between portions 56 and 57 is such as to accommodate the height of the wire 44 when the multi-tipped probe assembly is brought into near proximity of the device to be tested as shown in FIG. 8. During testing the operational head 120 of the system that includes probing assembly 62 is moved relative to the semiconductor device 100 by a stage having three degrees of freedom (XYZ) and body 122. Multi-tipped probe assembly 62 is mounted to body 122. Body 122 serves also to provide wire-outs to test equipment. Passing through body 122 are light source 124 and fiber optic bundle 126. Device to be tested 100 is removably mounted on XYZ stage 128. Alternatively 124 may be an E-beam source and 126 an E-Beam detector operating in electron microscopy or scanning electron microscopy mode, with the head 120 being mounted in a suitable vacuum. As there is strong support under multi-tipped probe assembly 62, this embodiment of the multi-tipped probe assembly is well suited for operation in a contact mode, wherein probe tip point 21 is in physical contact with the device to be tested 100. It is also possible to mount the probe assembly to an XYZ stage and keep the device to be tested stationary.

Figure 9:
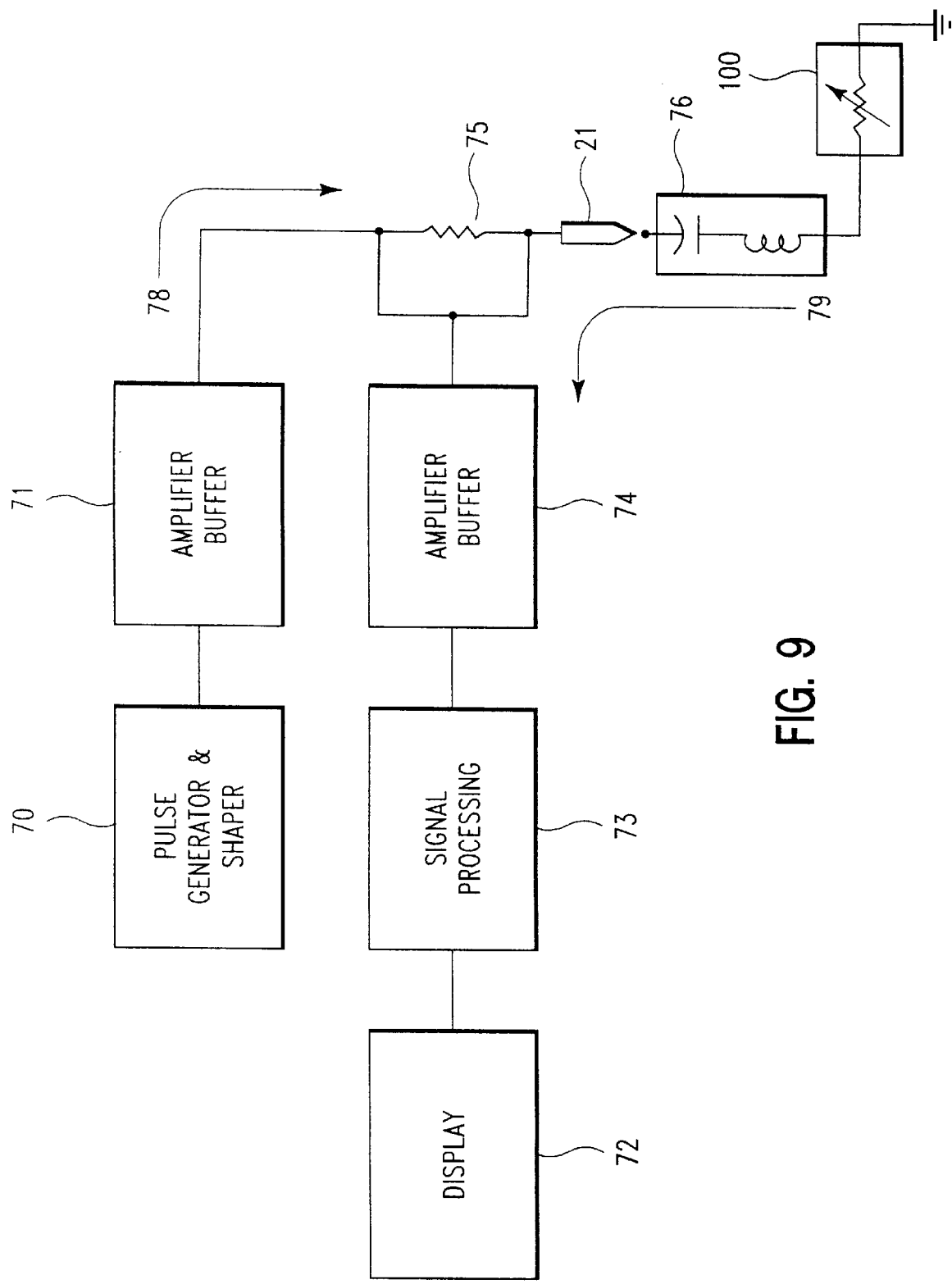
FIG. 9 is a schematic diagram for capacitive/inductive coupling of the electrical probe assembly of the present invention.

Attention is now directed to FIG. 9 which illustrates a test circuit which is designed for utilizing the probe tips of the present invention in a non-contact mode. A device 100 is capacitively/inductively coupled through air gap 76 to probe tip point 21. Probe tip point 21 is electrically coupled through bridging resistor 75 to amplifier buffer 71 which is coupled to pulse generator/shaper 70. This circuit provides input signal 78 to device 100 which is grounded during testing. Probe tip point 21 is also coupled to amplifier 74, which in turn is coupled to signal processor 73, which is coupled to display means 72. This circuit provides analysis of output signal 70 from device 100 during the testing process. Device 100 may also be stimulated by direct application of test signals through normal input means of the device under test such as I/O, power, and ground pads.

Figure 10A:
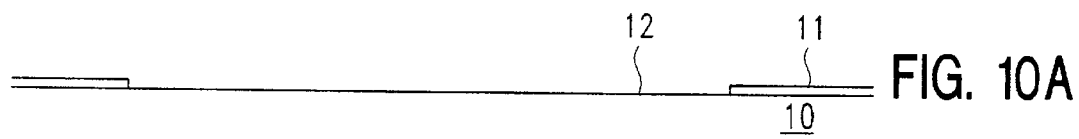
FIGS. 10A–10H show a sequence of cross section views illustrating the process steps of an alternative method for fabricating a multiple tip probe assembly having tips of different heights.
Figure 10B:
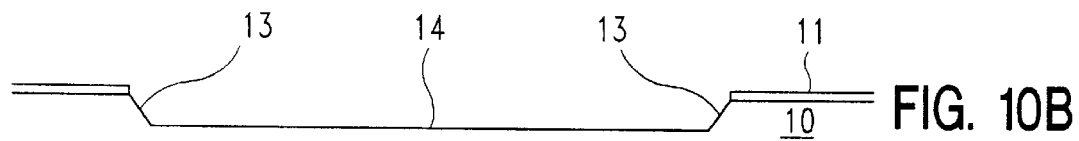
Figure 10C:
Figure 10D:
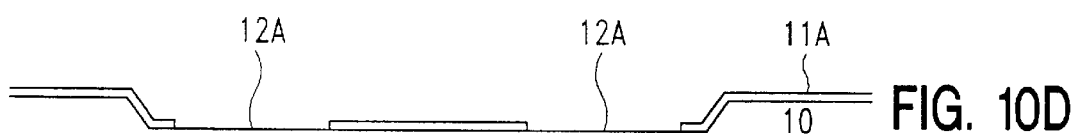
Figure 10E:
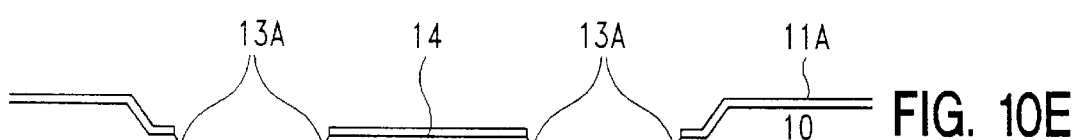
Figure 10F:
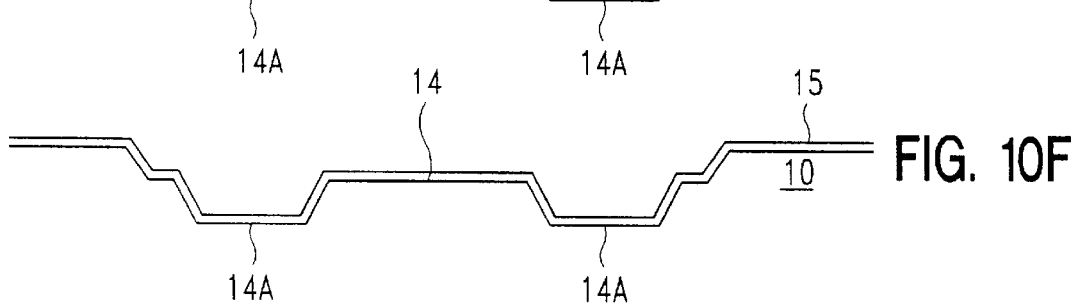
Figure 10G:
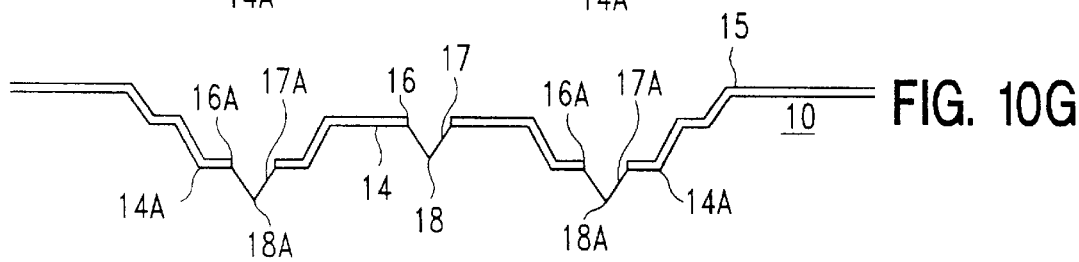
Figure 10H:
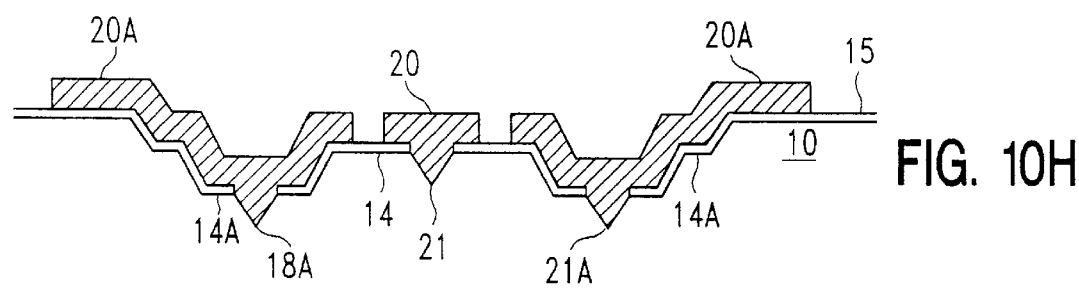

By adding a third silicon etch step to the method previously described, a multi-tip probe assembly where the individual probe tips are offset vertically from each other may be fabricated. For example, as illustrated in FIG. 10A silicon substrate 10 has a mask layer 11 on its top surface into which an opening 12 has been formed. FIG. 10B shows an etch trench having sidewall 13 and bottom surface 14 etched in silicon substrate 10 with a first silicon etch step. In FIG. 10C a mask layer 11A has been formed on the etched silicon substrate 10. FIG. 10D shows opening 12A formed into mask layer 11A. FIG. 10F mask layer 11A has been removed and replaced by mask layer 15 which has been formed on silicon substrate 10. In FIG. 10G, opening 16A has been formed in mask layer 15 over bottom surface 14A. A third silicon etch is performed and is stopped when pyramidal etch pits have been formed which have sidewall 17 and tip 18 in the bottom surface 14 and sidewall 17A and tip 18A in the bottom surface 14A. Deposition of a metal 20 and patterning that metal results in probe tip points 21 and 21A being offset vertically from each other. The probe tip may be completed by forming electrical connections by the process steps previously discussed in connection with FIG. 2, 3 or 4.

Figure 11B:
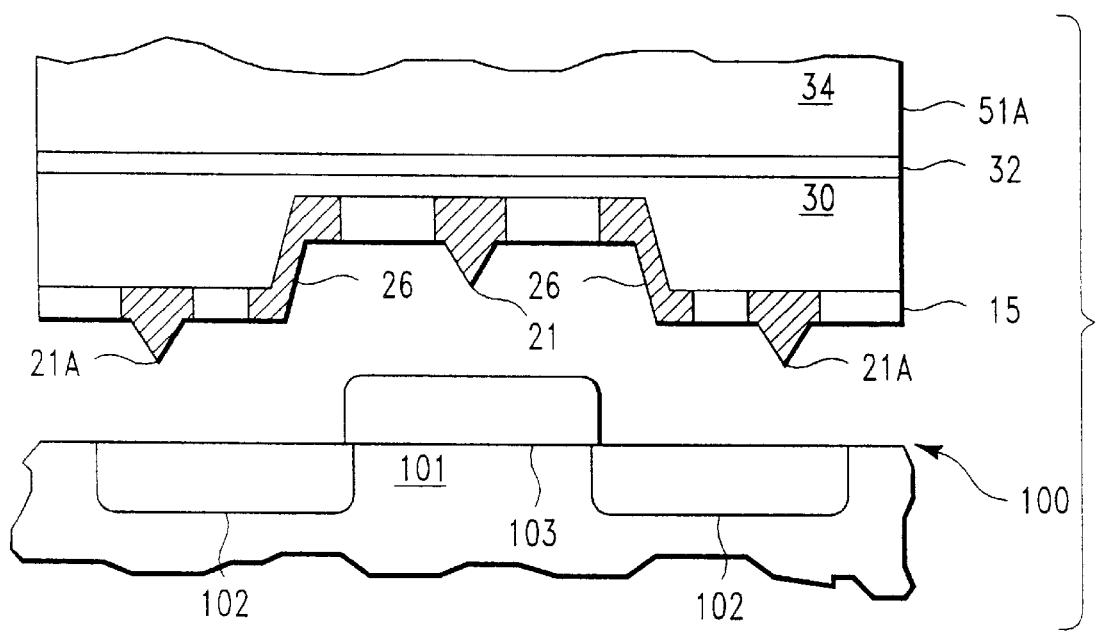
FIG. 11B is a cross section view through AA of FIG. 11A shown in proximity to a device to be tested.

FIG. 11 illustrates how the offset multi-tip probe assembly may be used in testing small structures such as individual transistors or groups of sub-micron lands on semiconductor devices. Probe assembly 51A is comprised of a central probe tip point 21 connected to conductive line 20 disposed at a different height than probe tip point 21A connected to lands 20A. Optional shield 26 may be inserted between the probe tip 21 as shown. In FIG. 11B the multi-tipped probe assembly is shown adapted for probing a device 100 to be tested. The device 100 includes a substrate 101, source/drain diffusion area 102, and gate 103. Probe tip point 21 is aligned to device gate 103, and probe tip point 21A is aligned to device/source drain 102. This configuration is required in contact mode and may be required for non-contact mode use of the multi-tipped probe when the structure to be tested has significant topology, as shown in FIG. 11B where the gate extends above the surface containing the source/drain. Obviously, in contact mode, the tips must touch both source/drain and the gate; and, in a non-contact mode, keeping the tip points the same distance from the gate as the source/drain would simplify coupling.

Figure 12A:
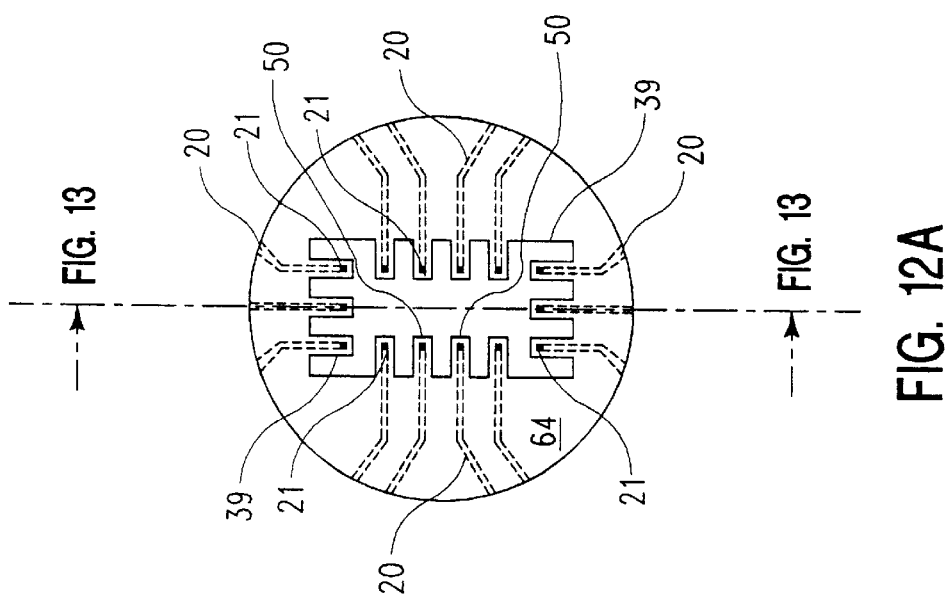
FIGS. 12 and 12A are top views of a probe card assembly containing an electrical probe assembly having a plurality of probe tips made according to the invention adapted to testing structures having terminal pad contacts.
Figure 12:
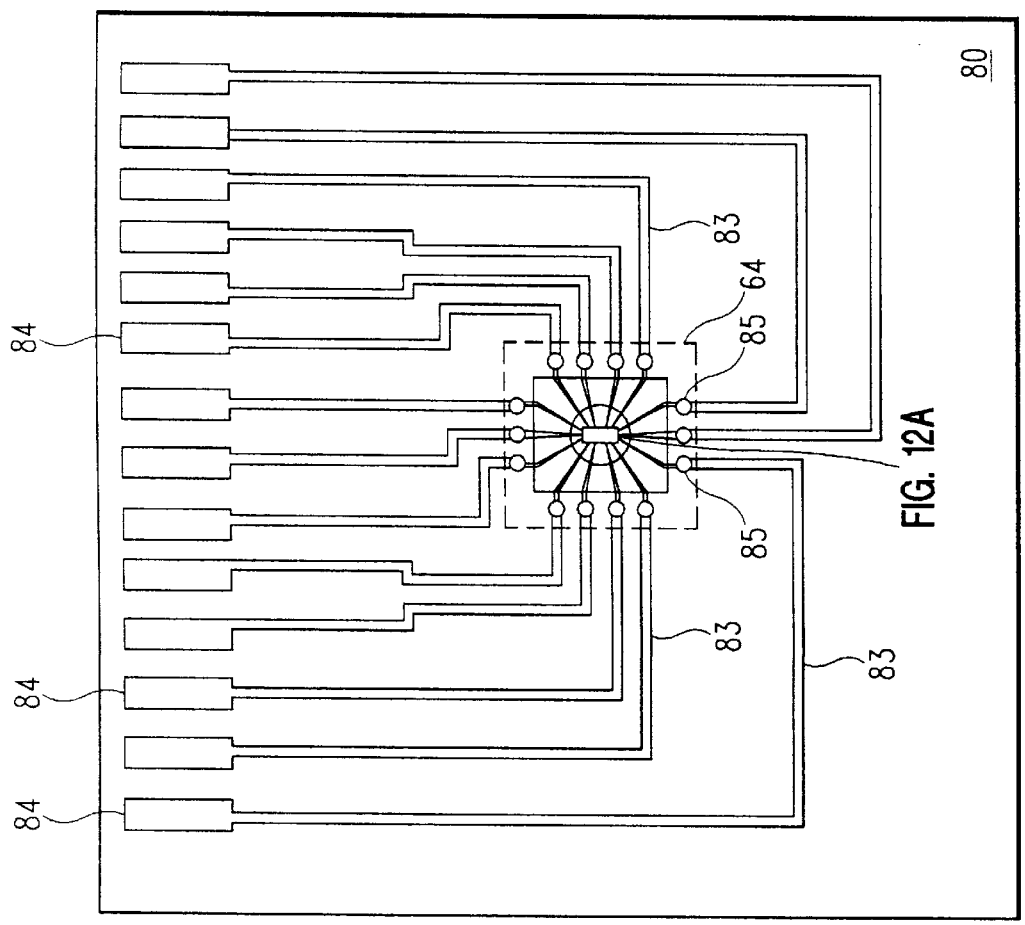

In another embodiment, the present invention may be adapted for probing structures having terminal pads using probe points having a base size of 5 to 20 microns or device interconnections using probe points having a base size of 1 to 5 microns. Referring to FIG. 12, probe card 80 has multi-tip probe assembly 64 mounted thereto. A multiplicity of probe assembly tip 50 having probe tip point 21 and land is arranged in a pattern that matches a pad pattern of the device to be tested. The probe assembly tip 50 extends into an optional opening between the probe tips and may be cut away to form a shaped opening 39 formed in the body of multi-tip probe assembly 64 to allow visual alignment of the tips to the device pads. Card 80 has a multiplicity of land 83 terminating in card connection 84 for insertion into a tester. Connection means 85 is provided to electrically connect land 20 on assembly 64 to card land 83.

Figure 13:
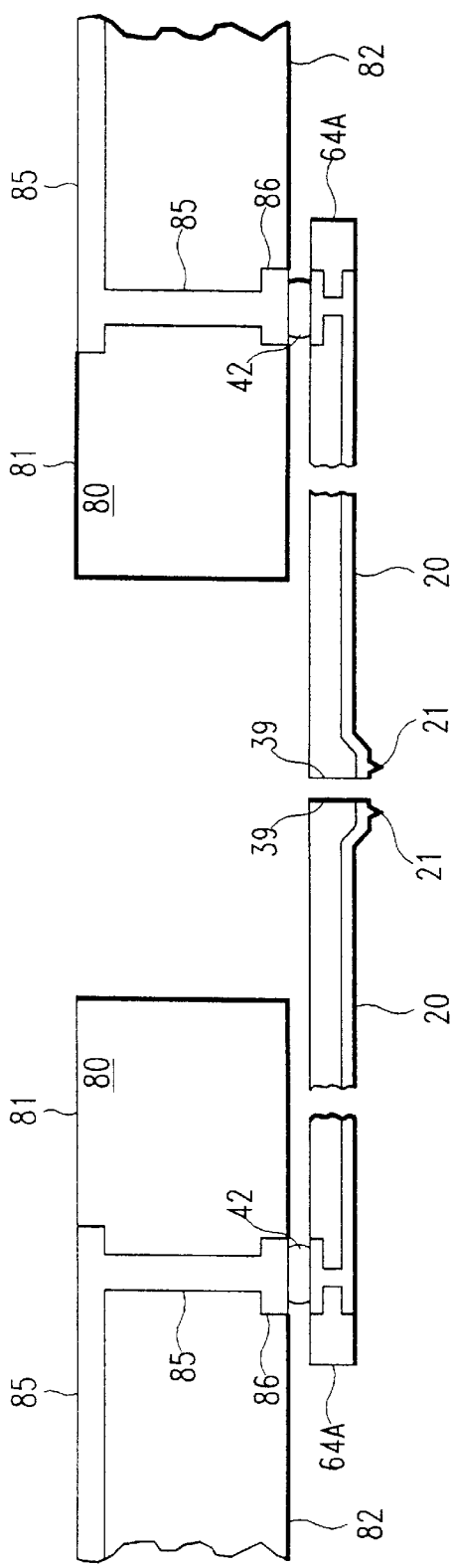
FIG. 13 is a cross section view of FIG. 12 when the probe assembly shown through AA of FIG. 12 comprises probe tips of the type illustrated in FIG. 2B.

FIG. 13 illustrates a method for connecting the probe tip shown in FIG. 2B to probe card 80. The multi-tip probe assembly 64A is mounted to the bottom side of probe card 80 by solder connection 42 which provide both structural and electrical connection.

Figure 14:
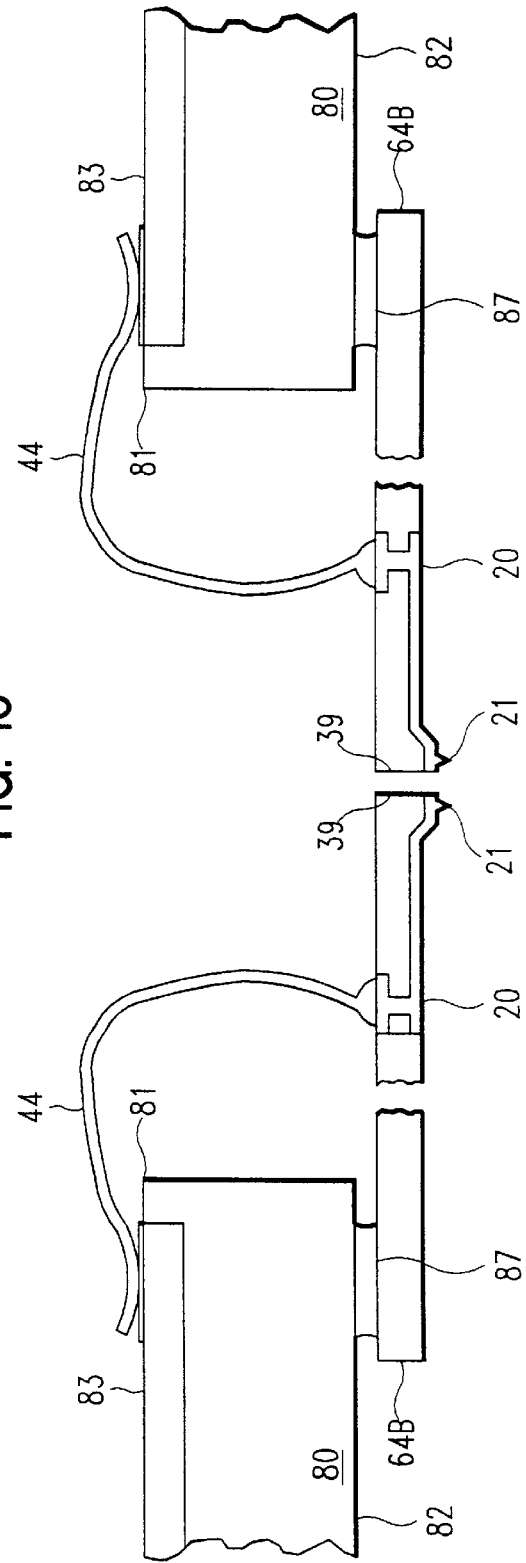
FIG. 14 is a cross section view of FIG. 12 when the probe assembly shown through AA of FIG. 12 comprises probe tips of the type illustrated in FIG. 3B.

FIG. 14 illustrates another method for connecting the probe tip shown in FIG. 3B to a probe card 80. In this configuration the multi-tip probe assembly 64B is mounted to the bottom side of probe card 80 by adhesive 87 which provides a structural connection. Electrical connection between land 20 and card land 83 is provided by wire 44.

Two further enhancements may be useful when dealing with low signal levels to reduce interference between probe tips or to match independence levels. This may be accomplished by providing a coaxial shielding around a single conductive land or line 20 or a triaxial shielding around multiple conductive lands or line 20.

Figure 15A:
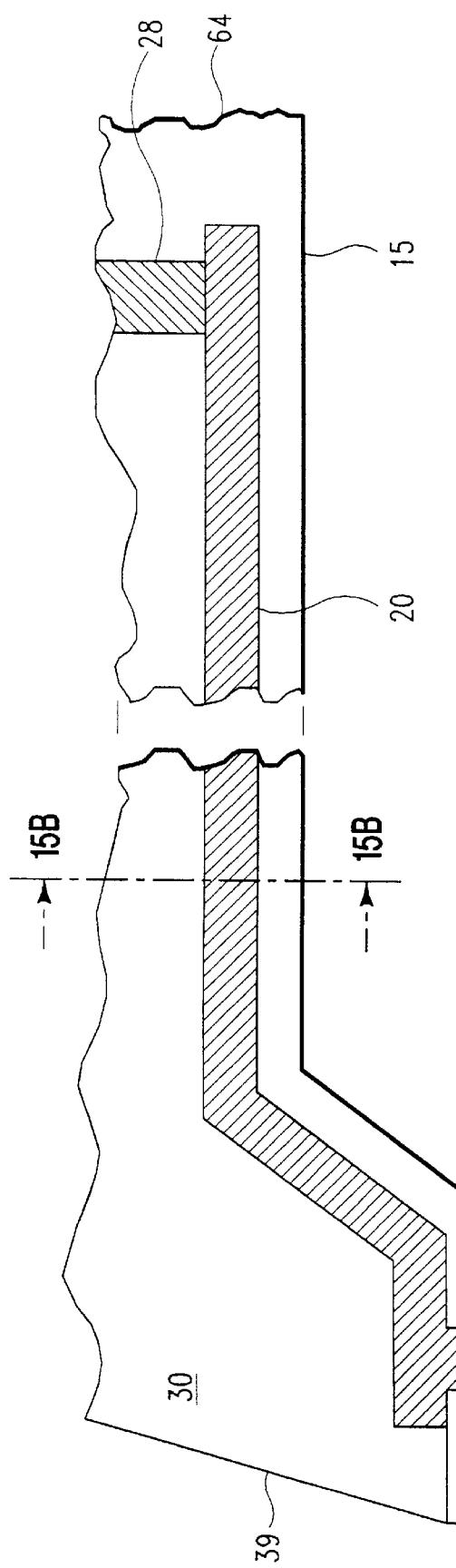
FIG. 15A is an enlarged cross section view of a single probe of the probe assembly illustrated in FIG. 13.
Figure 15B:
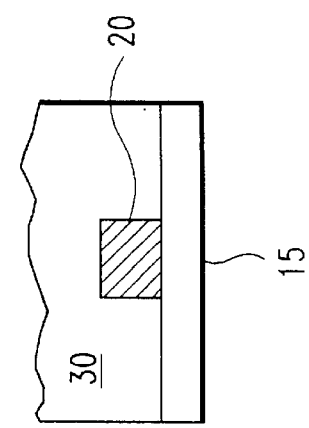
FIG. 15B is a cross section view through AA of FIG. 15A.

FIGS. 15A and 15B show a portion of the probe tip assembly 64 in the unshielded version. In FIGS. 16A–16B, conductive layer 90 is formed on mask layer 15 in the area of the intermediate portion 24 and terminal portion 25 of metal conductive line 20. A dielectric film 92 is deposited on conductive layer 90. Dielectric layer 94 is then formed on top of metal conductive line 20 in the area of the intermediate portion 24 and terminal portion 25 of metal conductive line 20. A conductive layer 96 is deposited on dielectric layer 94. Suitable materials for the dielectric layers 92 and 94 include deposited silicon oxide, silicon nitride, or metallic oxides. Suitable materials for the conductive layers 90 and 96 include tungsten, copper, aluminum or other metals. The thickness of layers 90, 92, 94 and 96 may be adjusted to yield a desired impedance value for the probe tip. In FIG. 16C, interconnection 95 has been provided to connect conductors 90 and 96 and totally surround the conductive line 20. This requires additional processing steps above that required for the structure shown in FIG. 16B. It is also possible to continue the shielding scheme to include sloped portion 23 and much of terminal portion 22 of metal conductive line 20.

In FIGS. 17A–17B conductive layer 100 is formed on mask layer 15 in the area of the intermediate portion 24 and terminal portion 25 of metal conductive line 20. Dielectric film 102 is deposited on conductive layer 100. Conductive layer 90 is formed on dielectric layer 102 and dielectric layer 92 is deposited on conductive layer 90. Dielectric layer 94 is formed on top of metal conductive line 20. Conductive layer 96 is deposited on dielectric layer 94. Dielectric layer 104 is formed on conductive layer 96 and conductive layer 106 is deposited on dielectric layer 104. Suitable materials for the dielectric layers 92, 94, 102 and 104 include deposited silicon oxide, silicon nitride or metallic oxides. Suitable materials for the conductive layers 90, 96, 100 and 106 include tungsten, copper, aluminum or other metals. The thickness of layers 90, 92, 94, 96, 100, 102, 104 and 106 may be adjusted to yield a desired impedance value for the probe tip. In FIG. 17C conductive interconnections 95 have been provided to connect conductors 90 and 96 and conductive interconnection 105 has been provided to connect conductors 100 and 106. This requires additional processing steps above that required for the structure shown in FIG. 17B. It is also possible to continue the shielding scheme to include sloped portion 23 and much of terminal portion 22 of metal conductive line 20.

The description of the embodiments of the present invention is given above for the understanding of the present invention. It will be understood that the invention is not to the particular embodiments described herein, but its capability for various modifications, rearrangements and substitutions will now become apparent to those skilled in the art without departing from the scope of the invention. Therefore it is intended that the following claims cover all such modifications and changes as fall within the true spirit and scope of the invention.

What is claimed is:

1. A method of forming a multi-tipped probe ring to probe a semiconductor device having a plurality of contact pads arranged in a fixed pattern, comprising the steps of:

forming a first masking layer on a top surface of a silicon substrate;

etching a first trench having a bottom in the silicon substrate utilizing the first masking layer;

forming a second masking layer on the first trench;

etching a plurality of second trenches having sidewalls tapering to a point into said bottom of said first trench utilizing said second masking layer;

depositing a conductive layer on said second masking layer and said second trenches to form a plurality of integral conductive lines and probe points in a predetermined pattern which are aligned with the contact pads;

depositing a first interlevel dielectric on the conductive lines and said second masking layer;

forming a portion of a first shield conductor on said first interlevel dielectric;

depositing a dielectric layer on said portion of a first shield conductor and said first interlevel dielectric layer;

planarizing said dielectric layer; and removing said silicon substrate.

2. The method of claim 1, further comprising the steps of:

forming a second interlevel dielectric on said portion of the first shield conductor; and forming a portion of a second shield conductor on said second interlevel dielectric.

3. The method of claim 1, wherein said conductive layer is selected from the group consisting of tungsten, copper, aluminum and gold.

4. The method of claim 1, wherein said first and second masking layers are selected from the group consisting of thermally grown silicon dioxide, CVD silicon dioxide and CVD silicon nitride.

5. The method of claim 2 wherein said dielectric layer is CVD oxide.

6. The method of claim 1, wherein said silicon substrate comprises monocrystalline silicon with a crystal orientation of <100>.

7. The method of claim 1, wherein said first trench is etched using an an-isotropic wet etch selected from the group consisting of aqueous tetramethy ammonium hydroxide, aqueous potassium hydroxide, alcoholic potassium hydroxide and aqueous ethylenediamine/pyrocatechol.

8. The method of claim 1, wherein said second trench has sidewalls forming a pyramidal etch pit and is etched using an an-isotropic wet etch selected from the group consisting of aqueous tetramethy ammonium hydroxide, aqueous potassium hydroxide, alcoholic potassium hydroxide and aqueous ethylenediamine/pyrocatechol.

9. The method of claim 1, wherein said second trench is formed by reactive ion etching with a gas mixture selected from the group consisting of $Cl_2/Ar, SF_6, Cl_2/He$, and $CCl_2F_2/O_2$.

10. The method of claim 1, wherein said silicon substrate is removed by wet etching using a wet etch selected from the group consisting of aqueous tetramethy ammonium hydroxide, aqueous potassium hydroxide, alcoholic potassium mydroxide and aqueous ethylenediamine/pyrocatechol.

* * * * *